(12) United States Patent
Müller et al.

(10) Patent No.: US 6,924,668 B2
(45) Date of Patent: Aug. 2, 2005

(54) DIFFERENTIAL TO SINGLE-ENDED LOGIC CONVERTER

(75) Inventors: David Müller, München (DE);
Volkmar Rebmann, München (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/672,393

(22) Filed: Sep. 25, 2003

(65) Prior Publication Data

US 2005/0068063 A1 Mar. 31, 2005

(51) Int. Cl.[7] ............................................ H03K 19/0175
(52) U.S. Cl. .......................... 326/83; 326/112; 326/115
(58) Field of Search ............................ 326/82, 83, 112, 326/115–119, 121, 126, 127

(56) References Cited

U.S. PATENT DOCUMENTS

| | | | | |
|---|---|---|---|---|
| 5,714,906 A | * | 2/1998 | Motamed et al. ........... | 327/563 |
| 5,953,276 A | * | 9/1999 | Baker .......................... | 365/208 |
| 6,111,431 A | * | 8/2000 | Estrada ........................ | 326/83 |
| 6,452,429 B1 | * | 9/2002 | Lim ............................. | 327/108 |
| 6,686,772 B2 | * | 2/2004 | Li et al. ....................... | 326/83 |

* cited by examiner

*Primary Examiner*—Don Le
(74) *Attorney, Agent, or Firm*—Jenkins, Wilson & Taylor, P.A.

(57) ABSTRACT

The present invention is a converter stage for converting a differential logic input signal and a corresponding common mode differential logic signal each having a first single-ended logic signal and a complementary second single-ended logic signal into a single-ended logic output signal. The converter stage comprises a first and a second differential stage each having a first and a second MOS transistor and a first and second current source for the differential stages. According to the invention the current sources are controlled by the voltage level which is centered between the mid-potentials of the common mode level differential logic signal and the mid-potential of the differential logic input signal.

16 Claims, 6 Drawing Sheets

US 6,924,668 B2

DIFFERENTIAL TO SINGLE-ENDED LOGIC CONVERTER

TECHNICAL FIELD

The present invention relates generally to voltage level converters. More particularly, the invention relates to a converter stage for converting a current mode differential logic level into a single-ended logic level.

BACKGROUND OF THE INVENTION

Current mode logic (CML) circuits are digital circuits where changes of logic levels are realized by switching currents instead of voltages. In MOS realizations of CML, the transistors used as switching elements are always in the saturation regime but the transistors remain within the active operating regions at all times. Thus, the transistors that are emitter coupled do not have a charge-storage time to content with and can change states very rapidly. An advantage of emitter coupled logic (ECL), or current mode logic (CML) respectively, is that it enables very high speed. However, current mode logic circuits have a relatively high current consumption because current flows through the transistors at all times. Therefore, CML logic circuits are employed where high speed is required, and they are combined with conventional CMOS circuits which operate slower but are less current consuming.

Integrated circuits which utilize differential current mode logic have different voltage ranges with respect to logic high and logic low voltage levels than CMOS technologies. Hence, if CMOS technologies and current mode logic circuits are used in a single integrated circuit a conversion of the current mode logic differential voltage levels into CMOS compatible voltage levels is required.

FIG. 1a shows a typical differential CMOS signal involving two complementary single-ended signals P, N wherein the highest voltage of the signals is usual referenced to the supply voltage VDD and the differential swing is about a few hundred millivolts. In contrast, a typical CMOS circuit operates according to one single-ended voltage within a specified voltage range. FIG. 1b shows a typical single-ended logic signal which has a maximum voltage corresponding to logic 1 and a minimum voltage corresponding to logic 0. Here, the logic high level is referenced to the supply voltage VDD and the logic low level is referenced to ground potential. It is readily understood that a combination of CML and CMOS circuitry in a single integrated circuit requires a conversion of the differential CML signal Vin into a single-ended CMOS signal Vout.

Accordingly, what is needed is a high speed converter for converting a differential input signal to single-ended output signal wherein the converter is robust against changes of temperature and supply voltage, and contains only a few electronic components.

SUMMARY OF THE INVENTION

It is an object of the present invention to provide a converter stage for converting a differential logic input signal and the corresponding common mode differential signal into a single-ended logic output signal.

This object is achieved according to the invention by means of a converter stage specified in claim 1.

The inventive converter stage includes a first differential stage having a first PMOS transistor and a second PMOS transistor wherein the gate terminal of the first PMOS transistor is coupled to the first single-ended signal of a common mode level differential signal, the gate terminal of the second PMOS transistor is coupled to the second single-ended signal of the common mode level differential signal, and the source terminals of the PMOS transistors are connected to a first current source.

The inventive converter stage further includes a second differential stage having a first NMOS transistor and a second NMOS transistor wherein the gate terminal of the first NMOS transistor is coupled to the first single-ended signal of the differential input signal. The gate terminal of the second NMOS transistor is coupled to the second single-ended signal of the differential input signal, and the source terminals of the NMOS transistors are connected to a second current source. The drain terminals of the NMOS transistors are connected to the drain terminals of the PMOS transistors.

An output is connected to a node between the drain terminal of the second PMOS transistor and the drain terminal of the second NMOS transistor for providing the single-ended logic output signal having an appropriate minimum and maximum voltage.

According to the invention the current sources are controlled by the voltage level which is between the mid-potential of the common mode level differential logic signal and the mid-potential of the differential logic input signal. The current sources are automatically controlled such that both current sources deliver the same constant current to the differential stages.

In a preferred embodiment of the invention the converter stage further comprises a complementary output node between the drain terminal of the first PMOS transistor and the connected drain terminal of the first NMOS transistor for providing an inverted single-ended output signal. An advantage of this preferred embodiment is that the single-ended output signal and the inverted complement are provided without any delay between the two signals due to the symmetry of the inventive converter stage.

In another preferred embodiment a first pair of resistors in series is connected between the gate terminal of the first PMOS transistor and the gate terminal of the second PMOS transistor. Further a second pair of resistors is connected in series between the gate terminal of the first NMOS transistor and the gate terminal of the second NMOS transistor. A node between the resistors of the first pair and a node between the resistors of the second pair advantageously provide the mid-potentials of the common mode level differential logic signal and the differential logic input signal, respectively.

In yet another preferred embodiment of the invention a third PMOS transistor and a third NMOS transistor are connected in series between the two current sources wherein the source terminal of the PMOS transistor is connected to the first current source and the source terminal of the third NMOS transistor is connected to the second current source.

The drain terminal of the third PMOS transistor is connected to the drain terminal of the third NMOS transistor, the gate terminal of the third PMOS transistor is connected to the node between the first pair of resistors, and the gate terminal of the third NMOS transistor is connected to the node between the second pair of resistors. In this advantageous configuration the voltage level at the node 18 between the two third NMOS and PMOS transistors is between the mid-potential of the common mode differential logic signal and the mid-potential of the differential logic input signal.

In a further preferred embodiment of the converter stage according to the invention the first current source is a fourth PMOS transistor wherein the source terminal of the fourth PMOS transistors is connected to a supply voltage VDD, and the second current source is a fourth NMOS transistor wherein the source terminal of the fourth NMOS transistor is connected to ground potential and the gate terminals of the fourth MOS transistors are connected to the node between the drain terminal of the third PMOS transistor and the drain terminal of the third NMOS transistor. In this preferred embodiment the two current sources are automatically controlled by the voltage level at the node between the drain of the third PMOS transistor and the drain of the third NMOS transistor, and the current sources deliver both the same constant currents.

In an alternative embodiment of the converter stage according to the invention the pairs of resistors are replaced by pairs of MOS transistors wherein the first pair of resistors is replaced by the source-drain paths of two NMOS transistors being connected in series between the gate terminal of the first PMOS transistor and the gate terminal of the second PMOS transistor. The gate terminals of the two pair-NMOS transistors are connected to a supply voltage. The second pair of resistors is replaced by the source-drain paths of a pair of PMOS transistors connected in series between the gate terminal of the first NMOS transistor and the gate terminal of the second NMOS transistor. The gate terminals of the two pair-PMOS transistors are connected to ground potential. An advantage of this alternative embodiment is that transistors are significantly easier to implement in CMOS circuits than conventional resistors.

In yet another preferred embodiment of the inventive converter stage inverter stages are connected to the outputs. This embodiment has the advantage that the single-ended output signals are more stable and cover a full swing between ground and supply voltage.

In a further preferred embodiment the differential logic input signal is a current mode logic signal and the single-ended logic output signal is a CMOS logic signal. Preferably the first and second PMOS transistors have the same geometric size and the first and second NMOS transistors have the same geometric size in the circuit. The converter stage is preferably operated with differential logic input signals having a clock frequency higher than two gigahertz.

In a further development of the inventive converter stage the converter stage is connected to a means that generates a corresponding common mode differential logic signal from the differential logic input signal.

BRIEF DESCRIPTION OF THE DRAWINGS

FIG. 1(*b*) illustrates a typical single-ended logic signal

Like reference numbers denote identical or functionally identical elements in the drawings.

PREFERRED EMBODIMENTS OF THE INVENTION

The present invention is a converter stage for converting a differential logic input signal and a corresponding common mode differential logic signal each having a first single-ended logic signal and a complementary second single-ended logic signal into a single-ended logic output signal.

Figure 1A:
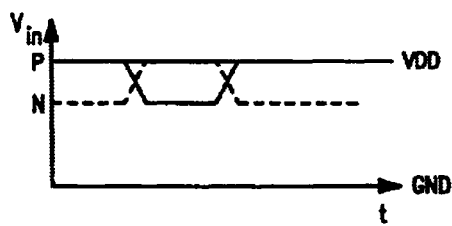
FIG. 1(*a*) illustrates a typical differential logic signal.
Figure 1B:
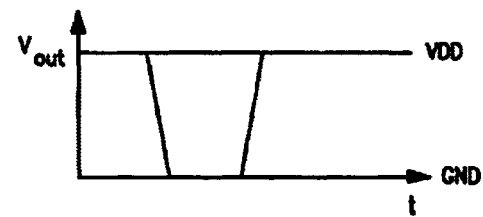
Figure 2:
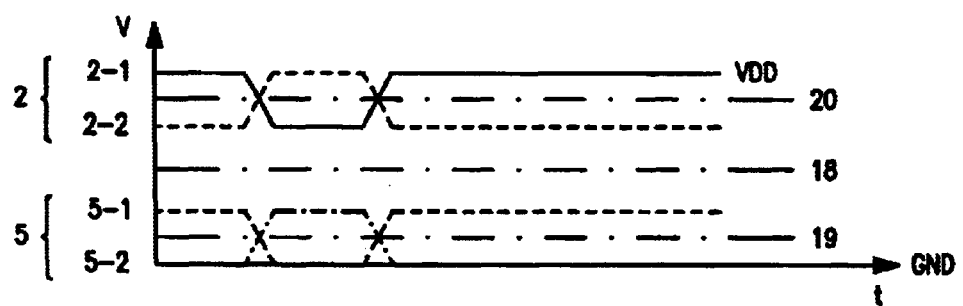
FIG. 2 illustrates a differential signal and its corresponding common mode differential signal.

FIG. 2 shows a typical differential current mode logic signal 2 that comprises a first single-ended logic signal 2-1 and a complementary second single-ended logic signal 2-2, wherein the mid-potential 20 of the differential signal 2 is centered between the minimum and maximum voltage level of the signal 2 corresponding to the two logic levels. The corresponding common mode differential logic signal 5 comprises a first and a second single-ended logic signal 5-1, 5-2 each having a minimum voltage level and a maximum voltage level and a mid-potential centered in between 19. In the common mode logic signal 5 the minimum voltage level is usually referenced to ground GND. FIG. 2 further illustrates a potential 18 which is roughly centered between the two mid-potentials 19, 20 of the differential logic signal and the corresponding common mode differential logic signal 5.

Figure 3:
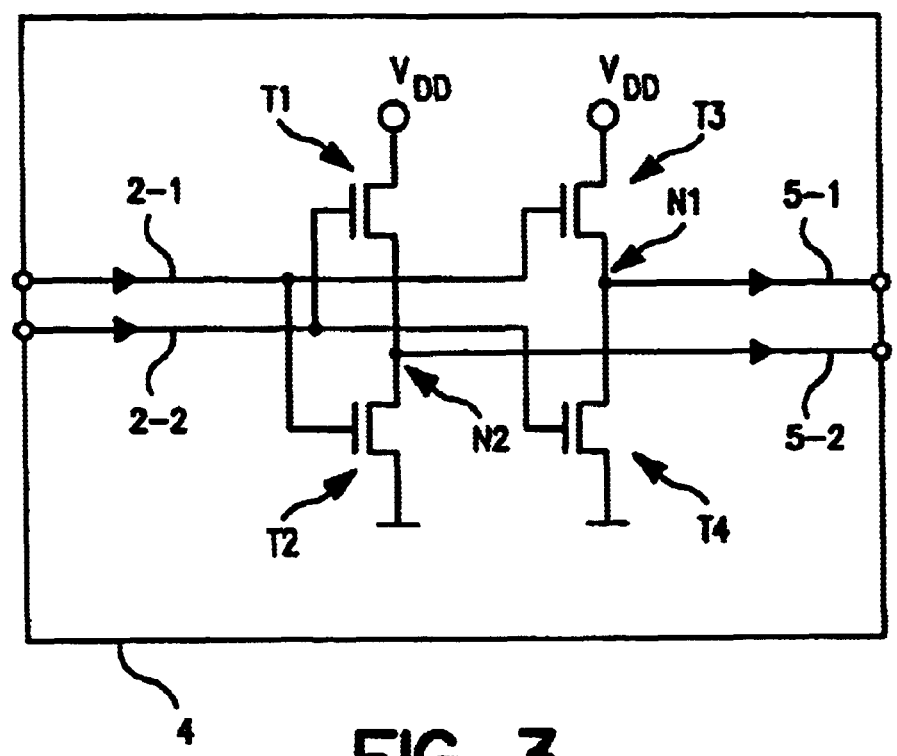
FIG. 3 illustrates an embodiment of a differential logic signal to common mode differential logic signal converter.

FIG. 3 illustrates a common embodiment of a differential logic signal to common mode differential logic signal converter 4. The converter 4 comprises a first pair of transistors T1, T2 wherein the respective source-drain paths are connected in series between a supply voltage VDD and ground potential, and wherein the gate terminal of the first transistor T1 is coupled to the second single-ended logic signal 2-2 of the differential logic input signal 2 and the gate terminal of the second transistor T2 is coupled to the first single-ended logic signal 2-1 of the differential logic signal 2. The converter 4 comprises a second pair of transistors T3, T4 wherein the respective source-drain paths are connected in series between a supply voltage VDD and ground potential, the gate terminal of the first transistor T3 of the second pair is connected to the first single-ended logic signal 2-1, and the gate terminal of the second transistor T4 of the second pair is connected to the second single-ended logic signal 2-2 of differential logic input signal 2. The common mode differential logic signal 5 comprises two single-ended logic signals 5-1, 5-2, wherein the first single-ended common mode logic signal 5-1 is provided on a node N1 between the source-drain paths of the transistors of the second pair of transistors T3, T4, and the second single-ended signal 5-2 of the common mode level differential signal 5 is provided on a node N2 which is situated between the source-drain paths of the transistors T1, T2 of the first pair.

Figure 4:
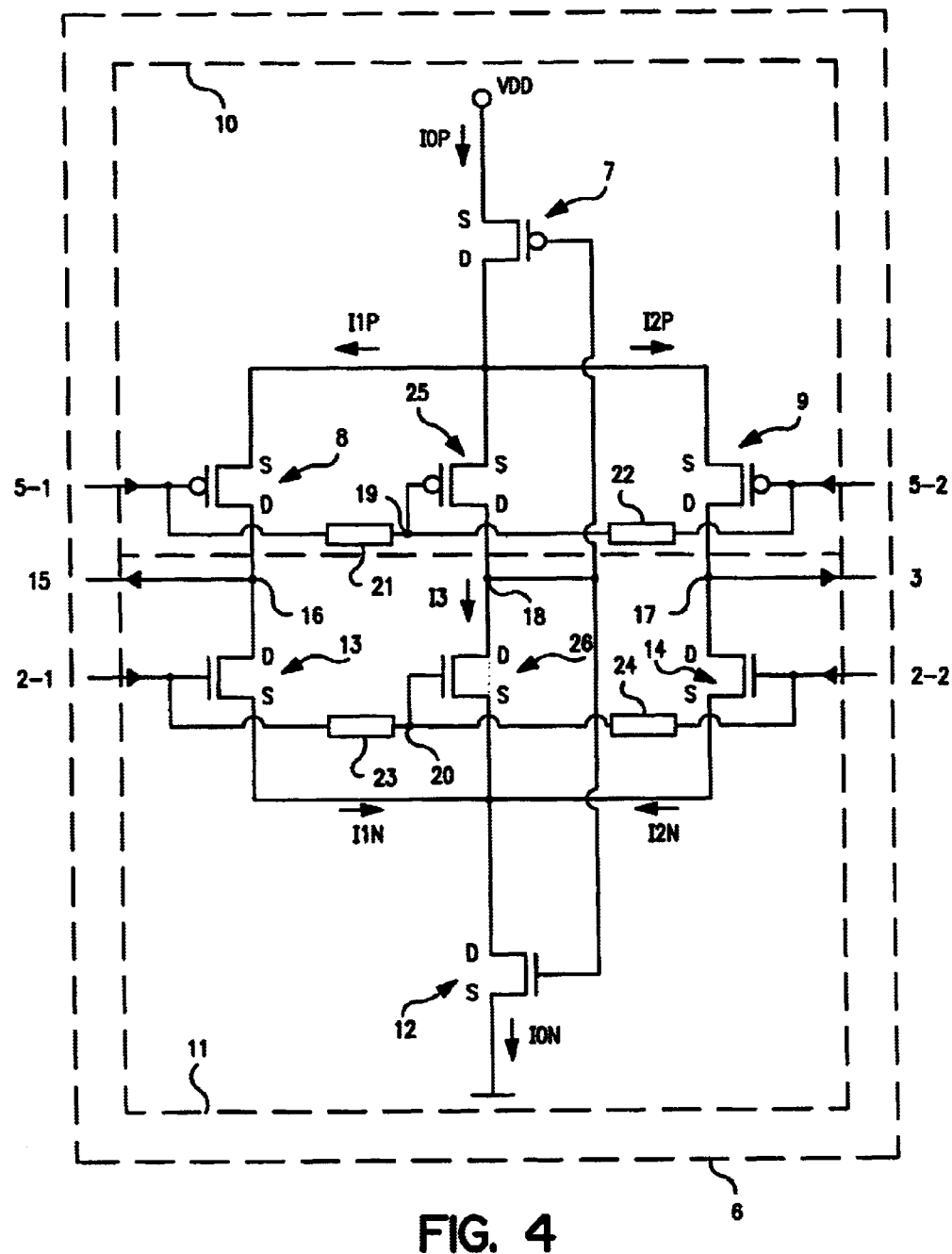
FIG. 4 illustrates a preferred embodiment of the inventive converter stage.

FIG. 4 shows a preferred embodiment of the converter stage according to the invention. The converter stage includes the first differential stage 10 and a second complementary differential stage 11.

The first differential stage 10 comprises a first PMOS transistor 8 and a second PMOS transistor 9 wherein the gate terminal of the first PMOS transistor 8 is coupled to the first single-ended signal 5-1 of the common mode level differential signal 5, and the gate terminal of the second PMOS transistor 9 is coupled to the second single-ended signal 5-2 of the common mode level differential signal 5. The source terminals of the PMOS transistors 8, 9 are connected to a first current source 7 which is realized by transistor.

The second complementary differential stage 11 comprises a first NMOS transistor 13 and a second NMOS transistor 14 wherein the gate terminal of the first NMOS transistor 13 is coupled to the first single-ended signal 2-1 of the differential input signal 2 and the gate terminal of the second NMOS transistor 14 is coupled to the second single-ended signal 2-2 of the differential signal. The source terminals of the NMOS transistors 13, 14 are connected to a second current source 12 which is realized by a transistor.

The drain terminals of the NMOS transistors 13, 14 of the second differential stage 11 are connected to the drain terminals of the PMOS transistors 8, 9 of the first differential stage.

Preferably the PMOS transistors 8, 9 of the first differential stage 10 have the same geometric size, and the NMOS transistors 13, 14 of the second differential stage 11 have the same geometric size.

A first pair of resistors in series 21, 22 is connected between the gate terminal of the first PMOS transistor 8 and the gate terminal of the second PMOS transistor 9, hence providing the mid-potential of the common mode differential input signal 5 at a node 19 between the two resistors 21, 22 of the first pair.

A second pair resistors 23, 24 in series is connected between the gate terminal of the first NMOS transistor 13 and the gate terminal of the second NMOS transistor 14, hence providing mid-potential of the differential logic input signal 2-1, 2-2 at a node 20 between the two resistors 23, 24 of the second pair.

The preferred embodiment of the converter stage further comprises a third PMOS transistor 25 and a third NMOS transistor 26 wherein the source terminal of the third PMOS transistor 25 is connected to the first current source 7— or to the drain terminal of the forth PMOS transistor 7, respectively. The source terminal of the third NMOS transistor 26 is connected to the second current source 12— or to the forth NMOS transistor 12, respectively. The drain terminal of the third PMOS transistor 25 is connected to the drain terminal of the third NMOS transistor 26. The gate terminal of the third PMOS transistor 25 is connected to the node 19 between the resistors 21, 22 of the first pair, and the gate terminal of the third NMOS transistor 26 is connected to the node 20 between the resistors 23, 24 of the second pair.

Preferably, the size-ratio between PMOS transistors 8, 9 of the first differential stage 10 and the NMOS transistors 13, 14 of the second differential stage 11 is the same as the size-ration between the third PMOS transistor 25 and the third NMOS transistor 26.

Since the mid-potentials of the two differential signals at the nodes 19, 20 between the resistors are constant the potential at the node 18 between the third PMOS transistor 25 and the third NMOS transistor 26 is constant as well.

The current sources are realized by MOS transistors. The first current source is a fourth PMOS transistor 7 wherein the source terminal of the fourth PMOS transistor 7 is connected to a supply voltage VDD and the second current source is a fourth NMOS transistor 12 wherein the source terminal of the fourth NMOS transistor is connected to ground potential. The drain terminal of the fourth PMOS transistor 7 is connected to the source terminals of the first, second and third PMOS transistors 8, 9, 19, and the drain terminal of the fourth NMOS transistor 12 is connected to the source terminals of the first, second and third NMOS transistors 13, 14, 26. The current delivered by the fourth PMOS transistor 7 and the fourth NMOS transistor 12 is controlled by the voltage level at the node 18 between the drain of the third PMOS transistor 25 and the drain of the third NMOS transistor 26 because the gate terminals of the fourth MOS transistors 7, 12 are connected to the node 18 between the third MOS transistors 25, 26.

A single-ended logic output signal 3 is provided at a node 17 between the drain terminal of the second PMOS transistor 9 and the drain terminal of the second NMOS transistor 14. A complementary single-ended logic output signal 15 is provided at a node 16 between the drain of the first PMOS transistor 8 and the drain terminal of the first NMOS transistor 13. The second output provides an inverted output signal 15.

In order to center the switching point of the single-ended output signals 3, 15 exactly between the maximum voltage level corresponding to the supply voltage VDD and the minimum voltage level corresponding to ground the current sources 7, 12 of the differential stages 10, 11 have to deliver the same amount of constant current I0P, I0N. This is achieved through the replica path formed by the third PMOS transistor 25 and the third NMOS transistor 26 which are controlled by the mid-potential 19 of the respective differential logic input signal 2 and the mid-potential 20 of the corresponding common mode differential logic signal 5.

If the first single-ended logic signal 2-1 of the differential logic input signal 2 is on a logic high level the complementary second single-ended logic signal 2-2 of the differential logic input signal 2 is on a logic low level. Then, the current I2N through the source-drain path of the second NMOS transistor 14 is zero and the current I1N through the source drain path of the first NMOS transistor 13 is the difference between the current I0N delivered by the second current source 12 (or the fourth NMOS transistor 12, respectively) and the current I3 through the source-drain path of the third NMOS transistor 26 and third PMOS transistor 25 which are included in the replica path.

At the same time the first single-ended logic signal 5-1 of the common mode differential logic signal 5 on high logic level and the second single-ended logic signal 5-2 of the common mode differential logic signal 5 is on logic low level. Then, the current I1P through the source-drain path of the first PMOS transistor 8 is zero, and the current I2P through the source-drain path of the second PMOS transistor 9 is the difference between the current I0P delivered by the first current source 7 (or the fourth PMOS transistor 7, respectively) and the current I3 through the source-drain path of the third PMOS transistor 25 and the third NMOS transistor 26 in the replica path. Hence the voltage level at the output node 17 increases and the voltage level at the second complementary output node 16 decreases.

Preferably, the MOS transistors in the differential stages 10, 11 are chosen such that a current through a switched off source-drain path is zero for a swing of the differential signals, i.e. the difference between maximum voltage level and minimum voltage level corresponding to logic high and logic low level. The resistors 21, 22, 23, 24 should have all the same resistances and are preferably of about 20 kiloohm but they can have other resistances.

The voltage level between the third PMOS transistor 25 and the third NMOS transistor 26 in the replica path is roughly centered between the mid-potentials 19, 20 of the differential logic input signal 2 and the corresponding common mode differential logic signal 5. This generated voltage level 18 is used as a bias potential for the two current-source MOS transistors 7, 12, such that they automatically deliver the same amount of current I0P, I0N. Doing so, the switching point of the single-ended output signals 3, 15 is exactly centered between the voltage level corresponding to logic high and the voltage level corresponding to logic low.

In a further development of the converter stage 6 according to the invention inverter stages are coupled to the single-ended output signals 3, 15. The inverter stages rise the maximum voltage level of the single-ended output signal 3, 15 to a preferred maximum voltage level corresponding to a high logic level, for example the supply voltage VDD. And the inverter stages decrease the minimum voltage level of the single-ended output signals 3, 15 to a preferred minimum voltage level corresponding to a logic low level, for example ground potential.

An advantage of the preferred embodiment of the invention is that it has a very high switching velocity due to the small amount of switching devices. Another advantage is that the automatic control of the current sources 7, 12 is realized through a replica path formed by the source-drain paths of the third MOS transistors 25, 26. Therefore, the control does not influence the input and output signals. Yet another advantage of the preferred embodiment is that the rising edges and the falling edges of the single-ended output signals are generated symmetrically and by the same devices in the circuit. Further, the generation of the mid-potentials of the differential logic input signal and the corresponding common mode differential logic signal 5 is very robust against nonlinearities in the input signals. It is a further advantage of the inventive converter stage 6 that the inverted single-ended output signal 15 is provided without any delay with respect to the noninverted single-ended logic output signal 3.

Figure 5:
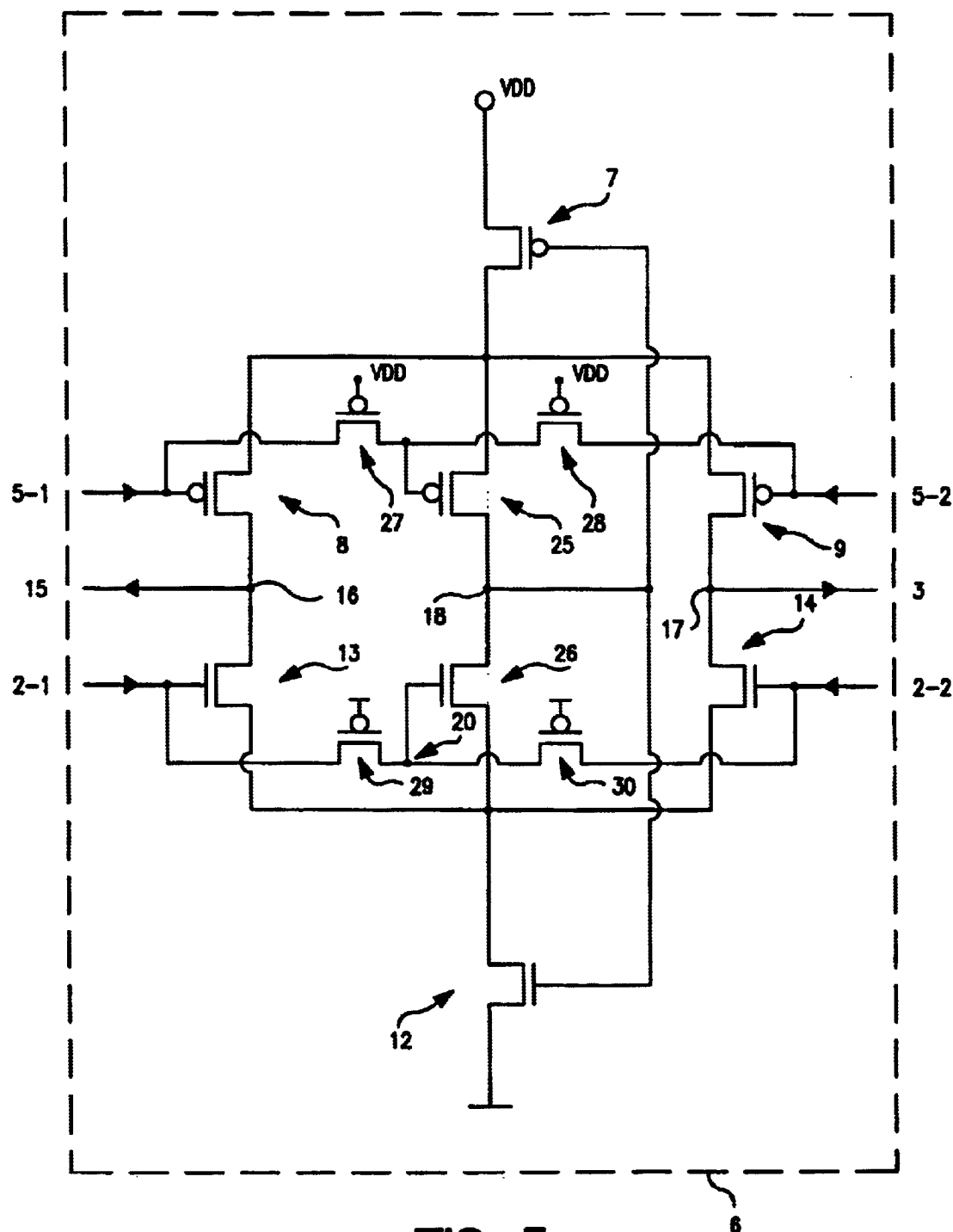
FIG. 5 illustrates an alternative embodiment of the converter stage according to the invention.

FIG. 5 shows an alternative embodiment of the converter stage 6 according to the invention wherein the resistors 21, 22, 23, 24 are replaced by the source-drain paths of MOS transistors 27, 28, 29, 30. The resistances of the respective source-drain paths are employed as resistors while the gate terminals of NMOS transistors 27, 28 are connected to the supply voltage VDD, and the gate terminals of PMOS transistors 29, 30 are connected to ground potential. The transistors are chosen and operated in their linear regime. An advantage of this alternative embodiment of the invention is that MOS transistors are easily implemented in integrated circuits containing a converter stage according to the invention.

In a second preferred embodiment of the converter stage 6 according to the invention the converter stage 6 is connected to a means 4 that generates the corresponding common mode differential logic signal 5 from the differential logic input signal 2.

Figure 6:
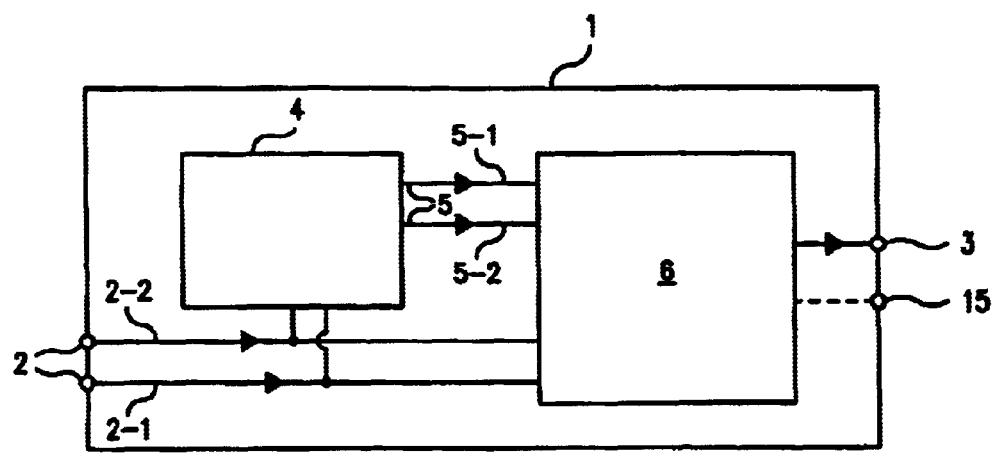
FIG. 6 illustrates another preferred embodiment of the converter according to the invention.

The second preferred embodiment is shown in FIG. 6. The converter 1 according to the second preferred embodiment of the invention for converting a differential logic input signal 2 having a first single-ended logic signal 2-1 and a second single-ended logic signal 2-2 into a single-ended logic output signal 3 comprises a means 4 for generating a common mode differential logic signal 5 having a first single ended logic signal 5-1 and a complementary second single-ended logic signal 5-2. The second preferred embodiment further comprises a converter stage 6 according to the invention that is coupled to the differential logic input signal 2 and coupled to the means 4 for receiving the corresponding common mode differential logic signal 5. Preferably the means 4 and the converter stage 6 are realized in the same integrated circuit.

While the invention has been particularly shown and described with reference to various embodiments, it will be recognized by those skilled in the art that modifications and changes may be made to the present invention without departing from the spirit and scope thereof. The scope of the invention should therefore be determined not with reference to the above description but with reference to the appended claims along with their full scope of equivalents.

What is claimed is:

1. A converter stage for converting a differential logic input signal and a corresponding common mode differential logic signal each having a first single-ended logic signal and a complementary second single-ended logic signal to a single-ended logic output signal comprising:

(a) a first differential stage having a first PMOS transistor and a second PMOS transistor wherein the gate terminal of the first PMOS transistor is coupled to the first single-ended signal of the common mode level differential signal, wherein the gate terminal of the second PMOS transistor is coupled to the second single-ended signal of the common mode level differential signal, and wherein the source terminals of the PMOS transistors are connected to a first current source;

(b) a second differential stage having a first NMOS transistor and a second NMOS transistor wherein the gate terminal of the first NMOS transistor is coupled to the first single-ended signal of the differential input signal, wherein the gate terminal of the second NMOS transistor is coupled to the second single-ended signal of the differential input signal, and wherein the source terminals of the NMOS transistors are connected to a second current source, and wherein the drain terminals of the NMOS transistors are connected to the drain terminals of the PMOS transistors;

(c) an output connected to the source terminal of the second PMOS transistor and to the drain terminal of the second NMOS transistor for providing the single-ended output signal; and (d) wherein the current sources are controlled by a voltage level that is centered between the mid-potentials of the common mode level differential logic signal and the mid-potential of the differential logic input signal such that both current sources deliver the same constant current.

2. A converter stage as claimed in claim 1, wherein the converter stage further comprises a complementary output between the drain terminal of the first PMOS transistor and the connected drain terminal of the first NMOS transistor for providing an inverted single-ended output signal.

3. A converter stage as claimed in claim 2, wherein the converter stage further comprises a third PMOS transistor and a third NMOS transistor wherein the source terminal of the third PMOS transistor is connected to the first current source, the source terminal of the third NMOS transistor is connected to the second current source, the drain terminal of the third PMOS transistor is connected to the drain terminal of the third NMOS transistor, the gate terminal of the third PMOS transistor is connected between a first pair of resistors, and the gate terminal of the third NMOS transistor is connected between a second pair of resistors.

4. A converter stage as claimed in claim 3, wherein the current sources are controlled by the voltage level between the drain terminal of the third PMOS transistor and the drain terminal of the third NMOS transistor.

5. A converter stage as claimed in claim 4, wherein the first current source is a fourth PMOS transistor wherein the source terminal of the fourth PMOS transistor is connected to a supply voltage, the second current source is a fourth NMOS transistor wherein the source terminal of the fourth NMOS transistor is connected to ground potential and the gate terminals of the fourth MOS transistors are connected to the drain terminal of the third PMOS transistor and the drain terminal of the third NMOS transistor.

6. A converter stage as claimed in claim 2, wherein the converter stage further comprises a third PMOS transistor and a third NMOS transistor wherein the source terminal of the third PMOS transistor is connected to the first current source, the source terminal of the third NMOS transistor is connected to the second current source, the drain terminal of the third PMOS transistor is connected to the drain terminal of the third NMOS transistor, the gate terminal of the third PMOS transistor is connected between the source-drain paths of the pair-NMOS transistors, and the gate terminal of the third NMOS transistor is connected between the source-drain paths of the pair-PMOS transistors.

7. A converter stage as claimed in claim 6, wherein the first current source is a fourth PMOS transistor the source terminal of the fourth PMOS transistor being connected to a supply voltage (VDD), the second current source is a fourth NMOS transistor the source terminal of the fourth NMOS transistor being connected to ground potential and wherein the gate terminals of the fourth MOS transistors are connected to the drain terminal of the third PMOS transistor and the drain terminal of the third NMOS transistor.

8. A converter stage as claimed in claim 1, wherein the converter stage further comprises an inverter connected to the outputs.

9. A converter stage as claimed in claim 1, wherein the differential logic input signal is a current mode logic signal and the single-ended logic output signal is a CMOS logic signal.

10. A converter stage as claimed in claim 1, wherein the PMOS transistors of the first differential stage have the same geometric size and the NMOS transistors of the second differential stage have the same geometric size.

11. A converter stage as claimed in claim 1, wherein the size-ratio between the first and second PMOS transistors and the first and second NMOS transistors is equal to the size-ratio between the third PMOS transistor and the third NMOS transistor.

12. A converter stage as claimed in claim 1, wherein the differential logic input signal is a current mode logic signal with a clock frequency higher than two GHz and the single-ended logic output signal is a CMOS logic signal.

13. A converter stage as claimed in claim 1, wherein the converter stage is connected to a means for generating the corresponding common mode differential logic signal from the differential logic input signal.

14. A converter stage as claimed in claim 3, wherein the resistors have the same resistance.

15. A converter stage for converting a differential logic input signal and a corresponding common mode differential logic signal each having a first single-ended logic signal and a complementary second single-ended logic signal to a single-ended logic output signal comprising:

(a) a first differential stage having a first PMOS transistor and a second PMOS transistor wherein the gate terminal of the first PMOS transistor is coupled to the first single-ended signal of the common mode level differential signal, wherein the gate terminal of the second PMOS transistor is coupled to the second single-ended signal of the common mode level differential signal, and wherein the source terminals of the PMOS transistors are connected to a first current source;

(b) a second differential stage having a first NMOS transistor and a second NMOS transistor wherein the gate terminal of the first NMOS transistor is coupled to the first single-ended signal of the differential input signal, wherein the gate terminal of the second NMOS transistor is coupled to the second single-ended signal of the differential input signal, and wherein the source terminals of the NMOS transistors are connected to a second current source, and wherein the drain terminals of the NMOS transistors are connected to the drain terminals of the PMOS transistors;

(c) an output connected to the source terminal of the second PMOS transistor and to the drain terminal of the second NMOS transistor for providing the single-ended output signal;

(d) wherein the current sources are controlled by a voltage level that is centered between the mid-potentials of the common mode level differential logic signal and the mid-potential of the differential logic input signal such that both current sources deliver the same constant current;

(e) a complementary output between the drain terminal of the first PMOS transistor and the connected drain terminal of the first NMOS transistor for providing an inverted single-ended output signal;

(f) a first pair of resistors connected in series between the gate terminal of the first PMOS transistor and the gate terminal of the second PMOS transistor; and (g) a second pair of resistors connected in series between the gate terminal of the first NMOS transistor and the gate terminal of the second NMOS transistor.

16. A converter stage for converting a differential logic input signal and a corresponding common mode differential logic signal each having a first single-ended logic signal and a complementary second single-ended logic signal to a single-ended logic output signal comprising:

(a) a first differential stage having a first PMOS transistor and a second PMOS transistor wherein the gate terminal of the first PMOS transistor is coupled to the first single-ended signal of the common mode level differential signal, wherein the gate terminal of the second PMOS transistor is coupled to the second single-ended signal of the common mode level differential signal, and wherein the source terminals of the PMOS transistors are connected to a first current source;

(b) a second differential stage having a first NMOS transistor and a second NMOS transistor wherein the gate terminal of the first NMOS transistor is coupled to the first single-ended signal of the differential input signal, wherein the gate terminal of the second NMOS transistor is coupled to the second single-ended signal of the differential input signal, and wherein the source terminals of the NMOS transistors are connected to a second current source, and wherein the drain terminals of the NMOS transistors are connected to the drain terminals of the PMOS transistors;

(c) an output connected to the source terminal of the second PMOS transistor and to the drain terminal of the second NMOS transistor for providing the single-ended output signal;

(d) wherein the current sources are controlled by a voltage level that is centered between the mid-potentials of the common mode level differential logic signal and the mid-potential of the differential logic input signal such that both current sources deliver the same constant current;

(e) a complementary output between the drain terminal of the first PMOS transistor and the connected drain terminal of the first NMOS transistor for providing an Inverted single-ended output signal;

(f) a pair of NMOS transistors the source-drain paths being connected between the gate terminal of the first PMOS transistor and the gate terminal of the second PMOS transistor and the gate terminals of the pair-NMOS transistors being connected to a supply voltage (VDD); and (g) a pair of PMOS transistors the source-drain paths being connected between the gate terminal of the first NMOS transistor and the gate terminal of the second NMOS transistor and the gate terminals of the pair-PMOS transistors being connected to ground potential.

* * * * *